United States Patent [19]

Grudkowski et al.

[11] Patent Number: 4,491,761

[45] Date of Patent: Jan. 1, 1985

[54] PLANAR PIEZOELECTRIC DEFLECTOR WITH ARRAYS OF ALTERNATE PIEZOELECTRIC EFFECT

[75] Inventors: Thomas W. Grudkowski, Glastonbury; Anthony J. DeMaria; Alexander J. Shuskus, both of West Hartford; Daniel H. Grantham, Glastonbury, all of Conn.

[73] Assignee: United Technologies Corporation, Hartford, Conn.

[21] Appl. No.: 334,760

[22] Filed: Dec. 28, 1981

[51] Int. Cl.³ .............................................. H01L 41/08
[52] U.S. Cl. .................................... 310/359; 310/358
[58] Field of Search ............... 310/359, 366, 330, 331, 310/328, 800; 29/25.35

[56] References Cited

U.S. PATENT DOCUMENTS

| | | | |
|---|---|---|---|
| Re. 23,813 | 4/1954 | Adler . | |
| 2,540,187 | 2/1951 | Cherry, Jr. | 310/366 |
| 2,836,737 | 5/1958 | Crownover | 310/331 |
| 3,584,245 | 6/1971 | Helfen | 310/358 |
| 3,676,724 | 7/1972 | Berlincourt et al. | 310/358 |
| 3,760,203 | 9/1973 | Guntersdorfer | 310/359 |
| 3,943,387 | 3/1976 | Veith | 310/358 |
| 3,958,161 | 5/1976 | Dixon | 310/359 |

OTHER PUBLICATIONS

Gulton "Piezoceramic Thin Sheet", Product Description 1CN-7812, 1978.

*Primary Examiner*—R. Skudy
*Assistant Examiner*—D. L. Rebsch
*Attorney, Agent, or Firm*—M. P. Williams

[57] ABSTRACT

Low cost, easily reproducible piezoelectric deflector (8) operable with low voltages is achieved by providing an interdigital electrode configuration (12, 13) on a surface of piezoelectric material (10) having alternate sites (15, 16) with different piezoelectric response. A preferred embodiment polarizes the sites oppositely in a piezoelectric ceramic substrate (10). Alternate sites in piezoelectric crystals may be removed or have their piezoelectricity substantially reduced. Differential devices (8a, 8b) employ electrodes on both surfaces of the substrate, with a site at one surface being poled oppositely to an adjacent site at the other surface (FIG. 3) or with adjacent sites at both surfaces poled alike, and signal voltages applied oppositely (FIG. 4).

5 Claims, 4 Drawing Figures

PLANAR PIEZOELECTRIC DEFLECTOR WITH ARRAYS OF ALTERNATE PIEZOELECTRIC EFFECT

TECHNICAL FIELD

This invention relates to piezoelectric actuators or deflectors, and more particularly to planar piezoelectric actuators formed on a single substrate.

BACKGROUND ART

There are numerous electronic control system applications in which piezoelectric deflectors are potentially useful. These include, for instance, regulating fluid flow in a hydraulic amplifier system, regulating air or fuel in a combustion system, and so forth. The piezoelectric deflectors are desirable since they are less subject to damage as a result of vibration, and consume much less power than magnetic coil, solenoid type actuators. They also can be made much smaller and lighter.

In order to achieve a desired deflection, either a very long piece of piezoelectric material or stacks of thin piezoelectric slabs or platelets, with alternating electrodes, must be utilized. A large, single crystal actuator requires many kilovolts to establish the necessary field for the desired deflection. Use of stacks of polished wafers, with interspersed electrodes, can reduce the voltage requirements to between several hundred and several thousand volts, but are expensive due to the requirement of hand labor in assembling the stacks. Recent advances in microelectronics renders it highly desirable that all types of appropriate sensors be operable at compatible voltages (tens of volts, rather than hundreds of volts).

DISCLOSURE OF INVENTION

Objects of the invention include provision of piezoelectric deflectors capable of being reliably produced on a large scale at low cost, and capable of operation in response to low voltages.

According to the present invention, a planar piezoelectric deflector comprises a piezoelectric substrate having adjacent sites of alternate piezoelectric effect and an interdigital electrode structure on the surface of the substrate adjacent the sites to provide fields of like polarity to sites of like effect. In accordance further with the invention, alternate sites in a substrate of piezoelectric ceramic material, operated well below its Curie temperature, are poled to have opposite piezoelectric effect. According to other embodiments of the invention, alternate sites in piezoelectric crystals have their piezoelectric effect substantially reduced. In accordance further with the invention, a differential, planar piezoelectric deflector is provided with opposite effect on an upper surface from the effect on a lower surface by either having adjacent sites with opposite polarity on the upper surface from that of the lower surface, the electrode structures being driven with similar polarity, or by having sites on the upper surface of the same polarity as sites on the lower surface, but driving the electrode pattern on the upper surface oppositely from the electrodes on the lower surface.

The invention provides a piezoelectric deflector which is easily manufactured in large scale on a reproducible basis at low cost. The invention, by utilizing a single substrate with an interdigital electrode pattern thereon, permits utilization of small sites and therefore low voltages to achieve desired electric fields. The invention is readily manufactured utilizing microelectronic processes which are well known in the art in the light of the teachings which follow hereinafter.

The foregoing and other objects, features and advantages of the present invention will become more apparent in the light of the following detailed description of exemplary embodiments thereof, as illustrated in the accompanying drawing.

BEST MODE FOR CARRYING OUT THE INVENTION

Figure 1:
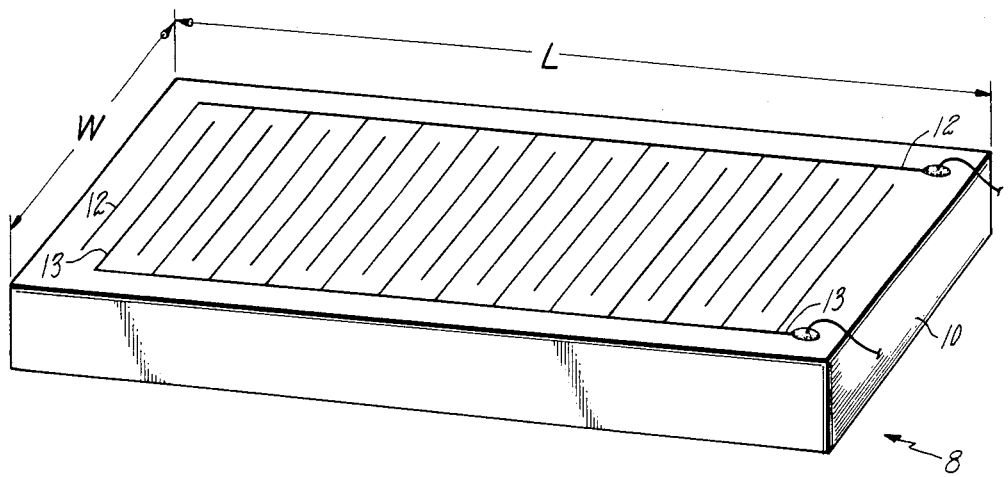
FIG. 1 is a perspective view of a planar piezoelectric deflector in accordance with the present invention.

Referring now to FIG. 1, a planar piezoelectric deflector 8, in accordance with the invention, comprises a single piezoelectric substrate 10 on which there is disposed a pattern of interdigital electrodes including a first set of commonly connected electrodes 12 and a second set of commonly connected electrodes 13, the electrodes 12, 13 being interspersed alternately with one another. The electrodes may, for instance, be deposited aluminum. The substrate 10 with the electrodes 12, 13 disposed thereon may be produced along with a number of other similar deflectors on a large wafer, subsequently to be cut to provide individual deflectors such as that shown in FIG. 1. The substrate 10 may, for instance, be on the order of one-half centimeter wide (W in FIG. 1), 1.5 centimeters long (L, FIG. 1), and on the order of 250 microns thick (t, FIG. 2). The periodicity between each electrode of the same polarity (P, FIG. 2) may vary widely, and devices have been successfully fabricated with periodicities ranging from 50 microns to 400 microns. The spacing (s, FIG. 2) between adjacent electrodes may range from 12 to 300 microns, and any suitable, reliable line width (w, FIG. 2) may be utilized. In fact, it is possible to have the spacing (s) and line width (w) equal to each other and each equal to one-quarter of the periodicity (p), if desired.

The piezoelectric substrate 10 may comprise piezoelectric ceramics, of the sort commonly referred to as PZT-4 and PZT-5, for instance each having a Curie temperature in excess of 300° C. Since PZT is a ceramic, it has no crystallographic orientation, and it therefore has no propensity to produce mechanical strain in response to electrode potential applied thereacross. However, once the substrate 10 is provided with the electrode pattern 12, 13, it may be poled by connecting approximately 2 volts per micron of electrode separation (s, FIG. 2) at a temperature near 120° C. for about three seconds. Poling can also be achieved at room temperature if larger poling fields are utilized. Once the piezoelectric substrate 10 is poled, it will only become depoled with zero voltage applied to the electrode pattern 12, 13 while being heated to a temperature in excess of the Curie temperature, around 350° C., for about one hour. If depoled, it can be again poled in the same or an opposite polarity. Other PZT material may be used, provided the poling temperature is not so high as to damage the electrodes. One particularly suitable PZT-4 material which has been used is Gulton material G-1195.

Figure 2:
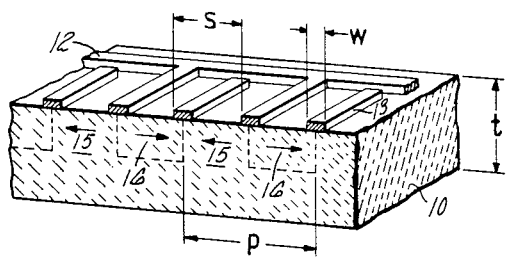
FIG. 2 is a partial, sectioned perspective view illustrating details of the planar piezoelectric deflector of FIG. 1.

Referring to FIG. 2, once poled in the manner described, the substrate 10 would have a plurality of sites 15 of one polarity, and a plurality of sites 16 of the opposite polarity. Thus, for a given polarity of signal voltage applied across the electrodes 12, 13 in the case where the material in the sites 15 would tend to expand, the material in the sites 16, responding to an electric field of opposite polarity, will also tend to expand. Thus, a "stacking" effect is achieved by interdigital electrodes disposed over corresponding sites of opposite polarity.

The strain, and therefore the resulting extension or contraction of the material, is a function of the electric field and the material used. By causing the polarity spacing (s, FIG. 2) to be progressively smaller, the same field can be achieved with smaller voltages across the electrodes 12, 13; similarly, for given voltages, the closer the spacing (s), the larger is the field applied to the sites. Therefore, it is easily seen that the invention allows formulation of piezoelectric deflectors capable of satisfactory operation at relatively low voltages (tens of volts) in contrast with the hundreds or thousands of volts required in prior art devices.

In the example given, several devices having electrode spacing ranging from 50 microns down to about 12 microns were deflected with signals ranging up to 50 volts. Deflections on the order of just over 1 micron per volt (for the 12 micron spacing) down to on the order of one-half micron per volt (for the 50 micron spacing) were observed.

Figure 3:
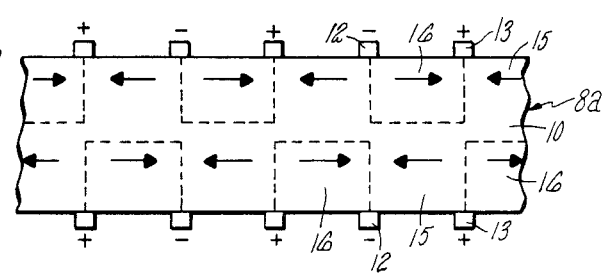
FIGS. 3 and 4 are partial, sectioned side elevation views of differential planar piezoelectric deflectors in accordance with the present invention.
Figure 4:
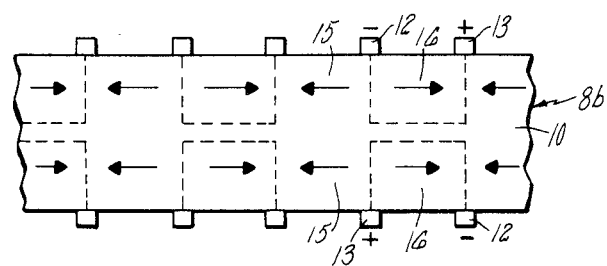

In the embodiment of FIG. 1, extension or contraction of only the upper surface causes the substrate to bend. As is known in the art, the extension and the contraction of a piezoelectric deflector can be amplified by providing a composite deflector such that an upper surface contracts at the same time as a lower surface extends, causing significant bending of the device. The present invention is easily incorporated into a differential device of this type by the simple expedient of providing sites 15, 16 and electrodes 12, 13 on both the upper surface and the lower surface. However, electrodes on the upper surface would be connected oppositely, e.g. 12−, 13+ on the upper surface; 12+, 13− on the lower surface during the poling procedure, but in operation would have signal voltages of the electrodes 12 on the upper surface applied in the same polarity as the signal voltages on electrodes 12 of the lower surface (as seen in FIG. 3). The obvious alternative way to achieve the differential form of the invention is illustrated in FIG. 4. Therein, during the poling procedure, the electrodes 12 on the upper surface would have the opposite polarity from the electrodes 12 on the lower surface (and similarly for the electrodes 13); but in operation, the electrodes 12, 13 in the upper surface would have the same polarity as electrodes 12, 13 at the lower surface. Comparison of FIGS. 3 and 4 illustrate that either the adjacent sites can be oppositely poled as in FIG. 3, in which case adjacent electrodes (e.g., electrodes 12 in FIG. 3) will have the same polarity of signal voltage applied in use; or, adjacent sites can have the same polarity (e.g., sites 15 in FIG. 4) and in use the adjacent electrodes (e.g., 12, 13 in FIG. 4) will have opposite polarity. Of course, if the substrate 10 is sufficiently thick to isolate the sites and fields of the upper surface from those of the lower surface, the sites and electrodes of the upper and lower surfaces need not be aligned with one another.

To provide a nonbending deflector, the electrode polarities of FIG. 3 could be used with the sites of FIG. 4, or vice versa.

The invention may also be practiced utilizing piezoelectric crystals, such as lithium niobate, quartz, or zinc oxide grown on a suitable substrate. In such case, the crystal must be provided with the desired suitable orientation (as is known). In addition, alternate sites must be modified. Since providing the alternate sites with an opposite piezoelectric effect would be very difficult in crystalline material, the alternate sites should either have their surface piezoelectricity destroyed, or such sites should be removed. Thus, if the sites 15 (FIG. 2) were left intact, the sites 16 could be subjected to ion implantation to create surface damage to significantly reduce the surface piezoelectricity thereof. Or, the sites 16 could be etched away; if etched away, there would be some difficulty in applying the electrode structure, so that refilling of the etched away sites 16 with a non-piezoelectric material, such as the substrate material vacuum deposited in an amorphous state, could be desirable.

The conductors 12, 13 are shown as being essentially centered on and aligned with the junctions between the adjacent sites. However, if the conductors are somewhat off perfect alignment, only a commensurate loss in efficiency will result. The essential thing is that the conductors overlay the junctions reasonably close thereto to provide the desired field polarity to the operative sites.

Thus although the invention has been shown and described with respect to exemplary embodiments thereof, it should be understood by those skilled in the art that the foregoing and various other changes, omissions and additions may be made therein and thereto without departing from the spirit and the scope of the invention.

We claim:

1. A planar piezoelectric deflector comprising a piezoelectric substrate having a plurality of first sites disposed adjacent a first surface thereof and a plurality of second sites interposed with said first sites, said first sites exhibiting a characteristic piezoelectric response to electric fields, said second sites exhibiting a piezoelectric response to electric fields different from that of said first sites, and a first interdigital conductor array disposed on said first surface and having a plurality of interconnected first conductors, each first conductor overlaying the junction between one of said first sites and one of said second sites, and having a plurality of interconnected second conductors, each second conductor overlaying the junction between one of said second sites and one of said first sites;

wherein the improvement comprises:

said first sites being composed of a piezoelectric crystal and said second sites having insignificant piezoelectric response to electric fields.

2. A planar piezoelectric deflector according to claim 1 further comprising a plurality of third sites dispersed adjacent a second surface thereof and a plurality of fourth sites interspersed with said third sites, said third sites having a piezoelectric response to electric fields different from that of said fourth sites, and a second interdigital conductor array disposed on said second surface and having a plurality of interconnected third conductors, each third conductor overlaying the junction between one of said third sites and one of said fourth sites, and having a plurality of interconnected fourth conductors, each fourth conductor overlaying the junction between one of said fourth sites and one of said third sites.

3. A planar piezoelectric deflector according to claim 2 wherein said conductive arrays on said first and second surfaces are mutually arranged with respect to the mutual piezoelectric response of said sites on said first and second surfaces so that the net piezoelectric effect on said first surface of fields impressed by said first array is opposite to the net piezoelectric effect on said second surface of fields impressed by said second array contemporaneously with like fields impressed by said first array, so that said substrate bends in response to fields impressed by said arrays.

4. A planar piezoelectric deflector according to claim 2 wherein said conductive arrays on said first and second surfaces are mutually arranged with respect to the mutual piezoelectric response of said sites on said first and second surfaces so that the net piezoelectric effect on said first surface of fields impressed by said first array is the same as the net piezoelectric effect on said second surface of fields impressed by said second array contemporaneously with like fields impressed by said first array, so that said substrate extends and contracts linearly, without bending, in response to fields impressed by said arrays.

5. A planar piezoelectric deflector comprising a piezoelectric substrate having a plurality of first sites disposed adjacent a first surface thereof and a plurality of second sites interposed with said first sites, said first sites exhibiting a characteristic piezoelectric response to electric fields, said second sites exhibiting a piezoelectric response to electric fields different from that of said first sites, and a first interdigital conductor array disposed on said first surface and having a plurality of interconnected first conductors, each first conductor overlaying the junction between one of said first sites and one of said second sites, and having a plurality of interconnected second conductors, each second conductor overlaying the junction between one of said second sites and one of said first sites, a plurality of third sites disposed adjacent a second surface thereof and a plurality of fourth sites interposed with said third sites, said third sites exhibiting a characteristic piezoelectric response to electric fields, said fourth sites exhibiting a piezoelectric response to electric fields different from that of said third sites, and a second interdigital conductor array disposed on said second surface and having a plurality of interconnected third conductors, each third conductor overlaying the junction between one of said third sites and one of said fourth sites, and having a plurality of interconnected fourth conductors, each fourth conductor overlaying the junction between one of said fourth sites and one of said third sites, said conductive arrays on said first and second surfaces being mutually arranged with respect to the mutual piezoelectric response of said sites on said first and second surfaces so that the net piezoelectric effect on said first surface of fields impressed by said first array is the same as the net piezoelectric effect on said second surface of fields impressed by said second array contemporaneously with like fields impressed by said first array, so that said substrate extends and contracts linearly, without bending, in response to fields impressed by said arrays.

* * * * *